United States Patent [19]
Murakami et al.

[11] Patent Number: 5,981,043
[45] Date of Patent: Nov. 9, 1999

[54] ELECTROCONDUCTIVE COATING COMPOSITION, A PRINTED CIRCUIT BOARD FABRICATED BY USING IT AND A FLEXIBLE PRINTED CIRCUIT ASSEMBLY WITH ELECTROMAGNETIC SHIELD

[75] Inventors: Hisatoshi Murakami; Shinichi Wakita; Tsunehiko Terada; Shohei Morimoto, all of Osaka, Japan

[73] Assignee: Tatsuta Electric Wire and Cable Co., Ltd, Osaka, Japan

[21] Appl. No.: 08/992,518

[22] Filed: Dec. 17, 1997

Related U.S. Application Data

[62] Division of application No. 08/637,460, Apr. 25, 1996, Pat. No. 5,736,070.

[51] Int. Cl.$^6$ ....................................................... B32B 9/00
[52] U.S. Cl. ........................... 428/209; 428/458; 428/901; 174/257; 174/261; 174/35 R; 361/818
[58] Field of Search ..................................... 428/209, 458, 428/901; 174/257, 35 R, 261; 361/818

[56] References Cited

U.S. PATENT DOCUMENTS

| | | | |
|---|---|---|---|
| 4,789,411 | 12/1988 | Eguchi et al. | 148/24 |
| 5,449,863 | 9/1995 | Nakatani et al. | 174/250 |
| 5,567,357 | 10/1996 | Wakita | 252/514 |

*Primary Examiner*—Timothy Speer
*Assistant Examiner*—Cathy F. Cam
*Attorney, Agent, or Firm*—Jordan and Hamburg LLP

[57] ABSTRACT

The invention provides a conductive, flexure-resistant electromagnetic-shielded flexible printed circuit assembly obtainable by forming a copper foil circuit on a heat-resistant plastic film, disposing successively thereon an undercoat layer, a metal-powder-containing electromagnetic paste shield layer and an overcoat layer, with the ground pattern of the copper foil circuit being electrically connected to the above shield layer through the undercoat layer at appropriate intervals.

5 Claims, 2 Drawing Sheets

ELECTROCONDUCTIVE COATING COMPOSITION, A PRINTED CIRCUIT BOARD FABRICATED BY USING IT AND A FLEXIBLE PRINTED CIRCUIT ASSEMBLY WITH ELECTROMAGNETIC SHIELD

This is a divisional continuation-in-part, of prior application Ser. No. 08/637,460, filed Apr. 25, 1996, now U.S. Pat. No. 5,736,070.

BACKGROUND OF THE INVENTION

The present invention relates to an electroconductive coating composition comprising a phenolic resin and a copper metal powder dispersed in said resin, and more particularly to an electroconductive coating composition with particularly improved electric conductivity, improved adhesion to copper foil and improved solder dip resistance for construction of the jumper circuit and electromagnetic shield of a printed circuit board, to a printed circuit board fabricated using said electroconductive coating composition and further to a durable flexible printed circuit assembly with electromagnetic shield.

As printed circuit boards for mounting IC, MSI, LSI etc., copper laminated insulation boards have been widely employed.

For insuring an effective utilization of the printed circuit formed on such a copper laminated insulation board, a bypass jumper circuit is provided on the printed circuit.

This jumper circuit is formed by the screen printing method which comprises forming a resist layer over the entire non-connected circuit region between copper foil circuits of a printed circuit and, then, applying a conductive silver coating composition (hereinafter referred to as a silver paste) between the copper foil circuits to be connected, skipping over the resist layer region. However, the silver paste is expensive. Moreover, although less expensive conductive copper coating compositions (hereinafter referred to as copper pastes) have been proposed as substitutes for the silver paste, these copper pastes are not dependable enough for use as the electroconductive coating composition for the formation of a jumper circuit because the use of a thermosetting phenolic resin as a main binder therein provides poor adhesion to the copper foil surface.

On the printed circuit of a printed circuit board, a shield layer is formed with a ground pattern or a resist layer interposed therebetween but the same problem in respect of adhesion to the copper foil surface of the ground pattern exists when said conventional copper paste is used for the formation of the shield layer.

Therefore, the inventors of the present invention previously proposed an electroconductive coating composition which is not costly and insures improved adhesion to copper foil and improved solder dip resistance (Japanese Patent Application No. 167229/1988).

However, the cured film of this coating composition was found to be deficient in the adhesion to the unoxidized copper foil surface.

To overcome the above-mentioned drawback, the present invention is intended to provide an electroconductive coating composition having improved adhesion to both the oxidized copper and unoxidized copper foil surfaces and improved electric conductivity and a printed circuit board fabricated using the same coating composition.

SUMMARY OF THE INVENTION

To overcome the above problems, the electroconductive coating composition of the present invention comprises the following components:

(A) 100 parts by weight of a copper metal powder coated with 0.05 to 0.2 weight part of a titanate, a zirconate or a mixture thereof;

(B) 5 to 30 parts by weight of resole phenolic resin;

(C) 0.5 to 4 parts by weight of a chelating agent;

(D) 0.1 to 5 parts by weight of an adhesion improving agent; and (E) 0.5 to 7 parts by weight of a conductivity improving agent.

In the above composition, the copper metal powder may be flaky, dendritic, spherical, amorphous or otherwise-configured. The particle diameter is preferably not greater than 100 $\mu$m and most desirably 1 to 30 $\mu$m. Grains less than 1 $\mu$m in diameter are ready to be oxidized to result in decreased conductivity of the coating film.

As the copper metal powder is coated with a titanate, a zirconate or a mixture thereof (each is hereinafter referred to as a dispersion aid), the dispersion of the powder in finely divided form into the resin matrix is assisted to contribute to stabilization of the quality and improvement in the conductivity of the electroconductive coating composition.

Furthermore, the surface treatment with a titanate and/or a zirconate eliminates the need for addition of a dispersing agent.

In the following description, the proportions of the respective components are indicated with the amount of copper metal powder being taken as 100 parts by weight.

The resole phenolic resin binds the copper metal powder and other components with efficiency and insures a long-term maintenance of electric conductivity.

The resole phenolic resin may be of ordinary type but in order to insure an appropriate film hardness and satisfactory electric conductivity, it is preferable to use a resole phenolic resin such that when the infrared spectrophotometric transmission values of its 2-mono-substitution, 2,4-disubstitution, 2,4,6-trisubstitution, methylol, dimethylene ether and phenyl groups are represented by l, m, n, a, b and c, respectively, the following relation holds between the respective transmission values:

(A) l/n=0.8~1.2

(B) m/n=0.8~1.2

(C) b/a=0.8~1.2

(D) c/a=1.2~1.5

The resole phenolic resin is used in a proportion of 5 to 30 parts by weight, preferably 9 to 20 parts by weight, to each 100 parts by weight of the copper metal powder.

When the proportion of said resole phenolic resin is less than 5 parts by weight, the resin does not bind the copper metal powder with a sufficient force so that the coating film tends to be friable. When, conversely, the proportion of this component exceeds 30 parts by weight, the electric conductivity of the cured coating film is not as high as desired.

The chelating agent is at least one member selected from the group consisting of aliphatic amines such as monoethanolamine, diethanolamine, triethanolamine, ethylenediamine, triethylenediamine, triethylenetetramine and the like. The chelating agent prevents oxidation of the copper metal powder and contributes to the perpetuation of electric conductivity.

The proportion of the chelating agent is 0.5 to 4 parts by weight, preferably 1 to 3.5 parts by weight, to each 100 parts by weight of the copper metal powder.

When the proportion of said chelating agent is less than 0.5 parts by weight, the electric conductivity of the coating film is not as high as desired, while the use of the chelating agent in a proportion over 4 parts by weight results in poor solder dip resistance, viz. resistance to the heat of soldering.

The adhesion improving agent includes a variety of adhesives.

Among natural resin adhesives which can be employed, rosins (gum rosins, tall oil rosin and wood rosin), rosin derivatives, terpene resins (terpenes and terpene phenol resins) are preferred. The synthetic resin adhesives are, inter alia, thermosetting adhesives of the petroleum resin type, butyral resin type, phenolic resin type, etc., thermoplastic adhesives of the vinyl acetate resin type, acrylic resin type, cellulosic type, phenoxy resin type, etc., and synthetic rubbers such as regenerated rubber, styrene-butadiene rubber, nitrile rubber, butyl rubber and so on. These adhesives either have the property to reduce the internal stress of the binder resole phenolic resin or contain functional groups which are responsible for adhesion (e.g. carboxyl, hydroxyl, long-chain alkyls, etc.).

When the proportion of the adhesion-improving agent is less than 0.1 part by weight, no improvement is realized in adhesion, while the use of this agent in excess of 5 parts by weight results in reduced electric conductivity.

The conductivity improving agent is preferably a nitrogen-containing compound having a phenyl group or a heterocyclic compound, and particularly preferred are compounds which will develop electric conductivity on chemical oxidative polymerization or electrolytic polymerization.

This type of compound includes, but is not limited to, amino-containing compounds such as aniline, di-phenylamine, N-phenyl-p-phenylenediamine, N,N'-di-phenyl-p-phenylenediamine, N-isopropyl-N'-phenyl-p-phenylenediamine, N,N'-diphenylbenzidine, aminophenol, diaminophenol, alkylated toluenediamines such as 5-t-butyl-3,4-toluenediamine, 5-isopropyl-2,4-toluenediamine, etc., p-phenylenediamine, 1,5-naphthalenediamine, cyclohexyl-p-phenylenediamine, ortho-tolylbeta-naphthylamine, o-anisidine, 4,5-diamine, aminopyrene, chrisazin, diaminonaphthalene, etc., pyrrole, amphoteric polypyrrole, thiophene, alpha-bipyrrole, 3-methylthiophene, phthalocyanine, phthalocyanine metal complexes, furan, selenophenes, erulophenes, tetrathiafulvalene, tetracyanoquinodimethane and so on.

When the proportion of said conductivity improving agent relative to the copper metal powder is less than 0.5 part by weight, no improvement is realized in electric conductivity (in terms of volume resistivity, it exceeds $1\times10^{-4}$ $\Omega\cdot$cm).

On the other hand, even if the conductivity improving agent is used in a proportion exceeding 7 parts by weight, no further improvement in electric conductivity can be expected because of saturation. Moreover, when an amino-containing compound is used in such a large proportion, the composition undergoes gelation which shortens its pot life. A decreased adhesion to the copper foil surface is an additional disadvantage.

In the electroconductive coating composition of the invention, an ordinary organic solvent can be incorporated in a suitable proportion for purposes of viscosity adjustment. The organic solvent mentioned above may be any of such known solvents as cellosolve acetate, carbitol, butylcarbitol, butylcellosolve acetate and so on.

The above electroconductive coating composition of the present invention is less expensive than the silver paste and is very satisfactory in the electric conductivity of the coating film and in the adhesion of the film to the copper foil surface, as well as excellent in solider dip resistance. Therefore, it is suited for the formation of a jumper circuit or an electromagnetic shield layer on a copper foil-clad printed circuit board and lends itself well to the mounting of IC, MSI, LSI and other devices by dipping it in a molten solder bath.

The electroconductive coating composition according to another aspect of the present invention is a coating composition containing 9 to 20 parts by weight of B component resole phenolic resin relative to 100 parts by weight of copper metal powder, otherwise, it is the same formulation as the coating composition described above. This coating composition is especially satisfactory in the balance between the physical characteristics and electric conductivity of the coating film.

The electroconductive coating composition according to another aspect of the present invention is a coating composition containing 1 to 3.5 parts by weight of C component chelating agent relative to 100 parts by weight of copper metal powder, otherwise, it is the same formulation as the coating composition described above. This coating composition is especially meritorious in respect of the balance between the electric conductivity and solder dip resistance of the coating film.

The printed circuit board according to another aspect of the present invention comprises a substrate, a copper foil circuit formed on at least one side of said substrate board, a first insulating layer disposed on non-connected circuit regions between predetermined circuit regions to be connected of said copper foil circuit, a jumper circuit interconnecting said predetermined circuit regions over said first insulating layer and a second insulating layer covering the printed circuit including said jumper circuit, said jumper circuit being formed from said electroconductive coating composition described above.

Since the jumper circuit is thus formed from the electroconductive coating composition of the present invention, this printed circuit board is excellent in the adhesion between the jumper circuit and copper foil circuit and in the electric conductivity of the jumper circuit.

The printed circuit board according to another aspect of the invention comprises a substrate, a copper foil circuit including a ground pattern as formed on at least one side of said substrate, an insulating layer formed on said substrate carrying said copper foil circuit in such a manner as to cover said copper foil circuit exclusive of at least a region of said ground pattern, and a conductive layer formed on said insulating layer in contact with the uninsulated region of said ground pattern, said conductive layer being formed from said electroconductive coating composition of the present invention.

Since its conductive layer is formed from the electroconductive coating composition of the present invention, this printed circuit board is not only excellent in the adhesion between said layer and ground pattern and in the electric conductivity of the conductive layer but remarkably inhibits the unwanted radiation.

Another aspect of the present invention relates to an electromagnetic-shielded flexible printed circuit assembly. This circuit assembly is now described in detail.

Among printed circuits, the so-called flexible printed circuit (hereinafter referred to briefly as the FPC) is used with great popularity today for miniaturization of electrical appliances or for purposes of assembling circuits into complicated mechanisms. The FPC in these applications must be flexible enough to facilitate assembling of electrical circuits into mechanisms but need not withstand repeated flexure.

Recently, the electronic interference of electrical or electronic devices is a major problem and the countermeasure so far proposed is either providing the casing of such a device with an electromagnetic shield function or applying a shield cover to each mechanical component so as to preclude leakage of electromagnetic waves.

However, even a cursory view of the current status of use of the FPC reveals that as in the case of application to printers for computers and word processors, the FPC is often required to withstand repeated flexure and be effectively shielded from electromagnetic radiation. The conventional FPC is poor in resistance to flexural fatigue and, when a shield layer is disposed on the FPC, its addition to the number of layers results in a further deterioration of flexure resistance. Under the circumstances, there is a demand for an FPC with improved resistance to repeated flexure and an electromagnetic shield function.

Another aspect of the present invention relates to a flexible printed circuit assembly comprising a copper foil circuit formed on a heat-resistant plastic film and, as formed successively on said circuit, an undercoat layer, a metal powder-containing electroconductive paste shield layer and an overcoat layer (hereinafter referred to as the OC layer), with a ground pattern of said copper foil circuit and said metal powder-containing electroconductive paste shield layer being electrically connected to each other at appropriate intervals through the undercoat layer (hereinafter referred to as the UC layer).

The construction of this invention is now described in further detail.

The heat-resistant plastic film, which is used in this invention, includes films of polyester, polyimide, polybenzimidazole, polyimideamide, adhesive silicone resin and other materials. All that is necessary is that the plastic film withstands the intensity and duration of heat treatment of the coating layers and of the curing of the electroconductive coating film. Therefore, aside from the specific resin films mentioned above, any other appropriate plastic films can also be employed.

The material to be used for the fabrication of the UC layer includes, as typical liquid coating materials, screen-printable synthetic resins such as epoxy resin, epoxy-melamine resin, polyurethane, butyl rubber, silicone elastomer, etc. and, as typical film materials, the same films as those used for the base film. In the case of the latter material, a roll laminator or the like is used in the fabrication.

As the electroconductive coating composition for this invention, the one of the present invention is employed. This particular composition is preferred because it contains a metal powder capable of forming an electromagnetic shield layer. The direct current resistance must be sufficiently low and the sheet resistance is preferably not more than 0.1 Ω/□. Any paste with a greater resistance value does not provide the desired degree of shield effect.

The dimension of said sheet resistance is "Ω/distance between opposed sides of a square". Thus, a board carrying an electroconductive coating layer is cut into a square testpiece and the electric resistance is measured with electrodes applied to opposed sides of the square testpiece. In other words, this dimension is "the value of electric resistance between opposed sides of an electroconductive coating film".

The material for construction of the OC layer is one that retains resiliency even after thermal curing and exhibits excellent resistance to repeated flexure, such as one-component type heat-curable silicone rubbers (TSE3212, 3221, 325, 325-B, 3251, 3251-C and 3252, all manufactured by Toshiba Silicone) and two-component heat-curable silicone adhesives (two-component addition type self-bonding silicone TSE 3360, Toshiba Silicone; SE1701, CY52-237 W/C and CY52-227A/B, Toray Silicone). As an alternative method of providing the OC layer, covering with a polyimide film similar to the base film can be mentioned.

Since, in the electromagnetic-shielded flexible printed circuit board described above, the copper foil circuit and the shield layer formed from the electroconductive paste are separated from each other by the extremely thin UC layer and the ground pattern and the shield layer are electrically connected to each other, the necessary prevention of electromagnetic interference, prevention of cross-talk between signal lines, and substantial reduction in the resistance of the ground pattern for electrical reinforcement can all be realized.

When the above electroconductive paste is used, the desired electrical characteristics can be insured even after long-term repeated flexure.

Furthermore, the use of the above material for the OC layer results in a phenomenal increase in the resistance to flexural fatigue.

In addition, since the shield layer is electrically connected to the ground pattern, terminal processing completes shield connection (connection of the ground pattern) at the same time.

The electromagnetic-shielded flexible printed circuit assembly according to another aspect of the invention is characterized in that, in the construction according to the aspect of the invention described above, said heat-resistant plastic film is a film of polyester, polyimide, polybenzimidazole, polyimideamide or adhesive silicone resin.

The electromagnetic-shielded flexible printed circuit assembly according to another aspect of the invention is characterized in that, in the construction according to the aspect of the invention described above, the undercoat and overcoat layers are formed from a material which retains resiliency even after heat treatment and offers excellent resistance to flexural fatigue, such as a one-component type heat-curable silicone rubber or a two-component type heat-curable silicone adhesive. In this construction, the interlayer pressure generated on flexure is relieved by said resiliency so as to prevent deterioration of electrical characteristics and insure a further increase in the resistance to flexural fatigue.

DETAILED DESCRIPTION OF THE PREFERRED EMBODIMENTS OF THE INVENTION

The following examples and comparative examples are intended to illustrate the invention in further detail and should by no means be construed as limiting the scope of the invention.

EXAMPLES 1 THROUGH 4 AND COMPARATIVE EXAMPLES 1 THROUGH 7

A mill was charged with 100 parts by weight of a dendritic copper metal powder with a grain size distribution of 5 to 10 μm, a specific surface area of not more than 0.4 $m^2$/g and a hydrogen reduction loss of not more than 0.25%. Then, a titanate was added in small portions with constant stirring for surface coating. Thereafter, a resole phenolic resin, a chelating agent, an adhesion improving agent and a conductivity improving agent were added as indicated in Tables 1 and 2 and kneaded together with the copper metal powder. As a solvent, some amount of butylcarditol was added and the whole mixture was kneaded using a three-roll mill for 20 minutes to prepare an electroconductive coating composition.

First, a solder resist was printed on a glass-epoxy substrate by the screen-printing method and cured in situ and, then, five conductive circuits, 1 mm wide, 25±5 μm thick and 60 mm long, were screen-printed on the solder resist by means of a 180-mesh Tetron screen and cured in an air oven at 160° C. for 30 minutes. The volume resistivity of the coating film was measured and the electric conductivity of the coating film was evaluated. The results are shown in Table 1 (Examples) and Table 2 (Comparative Examples).

On the other hand, the copper foil surface of a copper-clad laminated insulating board was cleaned and, using the electroconductive coating composition, a coating film, 50 mm×50 mm, was formed on the copper foil surface by the screen printing method and cured in the same manner as above. Then, in accordance with the cross-hatch test method of JIS K 5400 (1990), 11 longitudinal and as many transverse parallel cuts were made in the coating film at 1 mm intervals so as to form 100 squares per cm$^2$ and the film was pulled away with a cellophane tape. The number of squares left on the copper foil surface was counted and the adhesion of the coating film was evaluated. In Tables 1 and 2, the mark o signifies that the number of residual squares was 100 and the X mark signifies that the number of residual squares was not more than 99.

Figure 2:
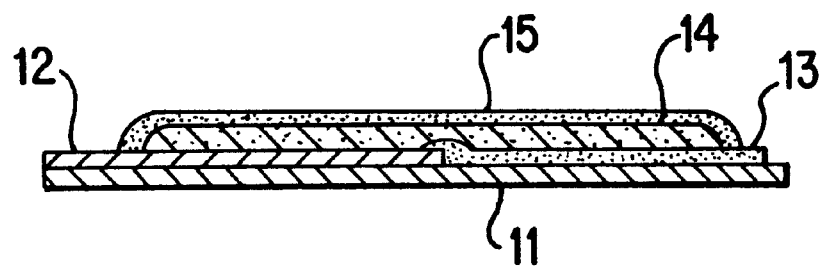
FIG. 2 is a sectional view showing a testpiece for evaluating the solder dip resistance of the electroconductive coating film.

The solder dip resistance of the coating film was evaluated as follows. Thus, a testpiece was prepared by the following method as shown in FIG. 2 and the testpiece was dipped in a molten solder bath at 260° C. for 60 seconds. The testpiece was then removed from the bath and the surface condition was examined. In Tables 1 and 2, the X mark signifies that the surface of the testpiece has a corrugation due to thermal deformation, while the mark o indicates that the surface has no corrugation.

Method of preparing the testpiece (See FIG. 2)

(1) On a glass-epoxy substrate 11, a cured solder resist layer 13 is formed using a solder resist ink in such a manner that the layer 13 partially overlaps a copper foil 12 formed on said glass-epoxy substrate 11 (curing condition 160° C., 30 minutes).

(2) By the screen printing method using the electroconductive coating composition, a copper paste layer 14 is formed on said copper foil 12 and solder resist layer 13 and cured (curing conditions 160° C., 30 minutes).

(3) By the screen printing method using a solder resist ink, a solder resist layer 15 is formed on the cured copper paste layer 14 and cured (curing conditions 150° C., 30 minutes).

It is apparent from Table 1 that because of the proper combination of specified components, Examples 1 through 4 are excellent in the electric conductivity of the coating

TABLE 1

| | Example | | | |
|---|---|---|---|---|
| | 1 | 2 | 3 | 4 |
| Copper metal powder | 100 | 100 | 100 | 100 |
| Titanate | 0.05 | 0.1 | 0.2 | 0.2 |
| Triethanolamine | 3 | 2.5 | 2.5 | 2.5 |
| Resole phenolic resin | 10 | 15 | 20 | 15 |
| Adhesion improving agent | | | | |
| Rosin adhesive | 3 | — | — | 3 |
| Alkylphenol resin | — | 2 | — | — |
| Butyral resin | — | — | 1 | — |
| Conductivity improving agent | | | | |
| Aminophenol | — | — | 5 | 6 |
| Pyrrole | — | 3 | — | — |
| Anisidine | 1 | — | — | — |
| Volume resistivity of coating film (×10$^{-4}$ Ωcm) | 0.7 | 0.5 | 0.5 | 0.5 |
| Adhesion between copper foil and coating film | o | o | o | o |
| Solder dip resistance of coating film | o | o | o | o |

TABLE 2

| | Comparative Example | | | | | | |
|---|---|---|---|---|---|---|---|
| | 1 | 2 | 3 | 4 | 5 | 6 | 7 |
| Copper metal powder | 100 | 100 | 100 | 100 | 100 | 100 | 100 |
| Titanate | 0.07 | 0.07 | 0.05 | 0.25 | 0.01 | 0.05 | 1.0 |
| Triethanolamine | 2.5 | 2.5 | 6 | 2.5 | 4 | 2.5 | 2.5 |
| Resole Phenolic resin | 15 | 15 | 5 | 15 | 15 | 35 | 20 |
| Adhesion inproving agent | | | | | | | |
| Rosin adhesive | 1 | 1 | 0.05 | — | — | — | — |
| Alkylphenol resin | — | — | — | 2 | — | — | — |
| Butyral resin | — | — | — | — | 1 | 1 | 6 |
| Conductivity improving agent | | | | | | | |
| Aminophenol | — | 15 | — | 5 | — | — | 5 |
| Pyrrole | 0.2 | — | 0.2 | — | 3 | — | — |
| Anisidine | — | — | — | — | — | 5 | — |
| Volume resistivity of coating film (×10$^{-4}$ Ωcm) | 3 | 0.7 | 10 | 0.5 | 2 | 20 | 5 |
| Adhesion between copper foil and coating film | x | x | x | x | o | x | x |
| Solder dip resistance of coating film | x | x | x | x | o | x | x | film, the adhesion between the copper foil and the coating film, and the solder dip resistance of the coating film.

Comparative Example 1 shows no improvement in electric conductivity because the amount of the conductivity improving agent is too small, while Comparative Example 2 shows only a low adhesion because the amount of the conductivity improving agent is too large.

Comparative Example 3 shows no improvement in adhesion because the amount of the adhesion improving agent is too small and no improvement in electric conductivity, either, because the amount of the conductivity improving agent is too small. Moreover, because of the excess of triethanolamine (chelating agent), the solder dip resistance is poor.

Comparative Example 4 is poor in adhesion to copper foil and in solder dip resistance because of the excess of titanate, but is satisfactory in electric conductivity.

Comparative Example 5 is poor in electric conductivity because of the shortage of the titanate, but is satisfactory in adhesion to copper foil and in solder dip resistance.

Comparative Example 6 is poor in electric conductivity because the amount of resole phenolic resin is too large.

Comparative Example 7 shows no improvement in electric conductivity because the amount of the adhesion improving agent is too large.

The above procedure was repeated using a zirconate in lieu of the titanate. The results were comparable to those in Examples 1 through 4 and Comparative Examples 1 through 7. However, whereas the volume resistivity of the coating film in Example 1 was $0.7 \times 10^{-4}$ Ω cm, the volume resistivity of the coating film obtained using the zirconate was $0.6 \times 10^{-4}$ Ω cm.

Figure 1:
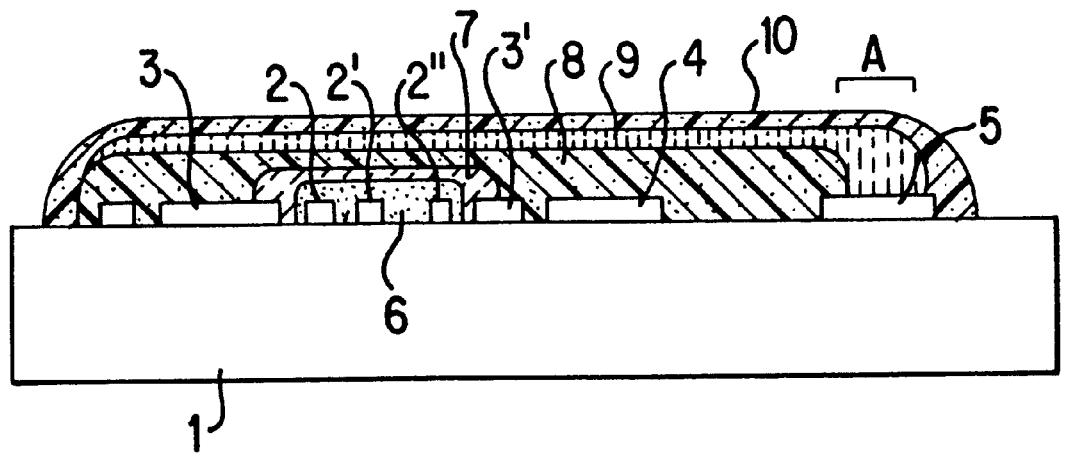
FIG. 1 is a sectional view showing a printed circuit board embodying the principles of the invention.

FIG. 1 shows a printed circuit board. On the surface of a substrate 1 made of an insulating material, which may be an epoxy resin, phenolic resin, glass fiber, ceramics or the like, there is first formed a circuit pattern. This circuit pattern includes signal line patterns 2, 2', 2", signal lands 3, 3' and a power supply pattern 4 and a ground pattern 5. Each of these patterns is formed by the conventional photolithographic process. After the necessary patterns are formed, a first insulating layer 6 is formed on the signal patterns 2, 2', 2" between the signal lands 3, 3' which are the lands of predetermined circuits to be connected. Then, using the electroconductive coating composition, a jumper circuit 7 for interconnecting said signal lands 3, 3' is formed on said first insulating layer 6. Thereafter, an undercoat layer 8 is formed, leaving a region A of the ground pattern 5 exposed. This undercoat layer 8 is a solder resist layer made of an insulating resin material. The region A where the ground pattern 5 is exposed is preferably formed over the largest possible area of the substrate but need only be in at least one position. This undercoat layer 8 can be easily formed by screen printing. After formation of the undercoat layer 8, a conductive layer 9 is superimposedly formed with the electroconductive coating composition and, further, an overcoat layer 10 is formed using an insulating resin material.

As the electroconductive coating composition for the formation of said jumper circuit 7 and conductive layer 9, the coating compositions of Examples 1 through 4 can be employed with particular advantage.

Figure 3:
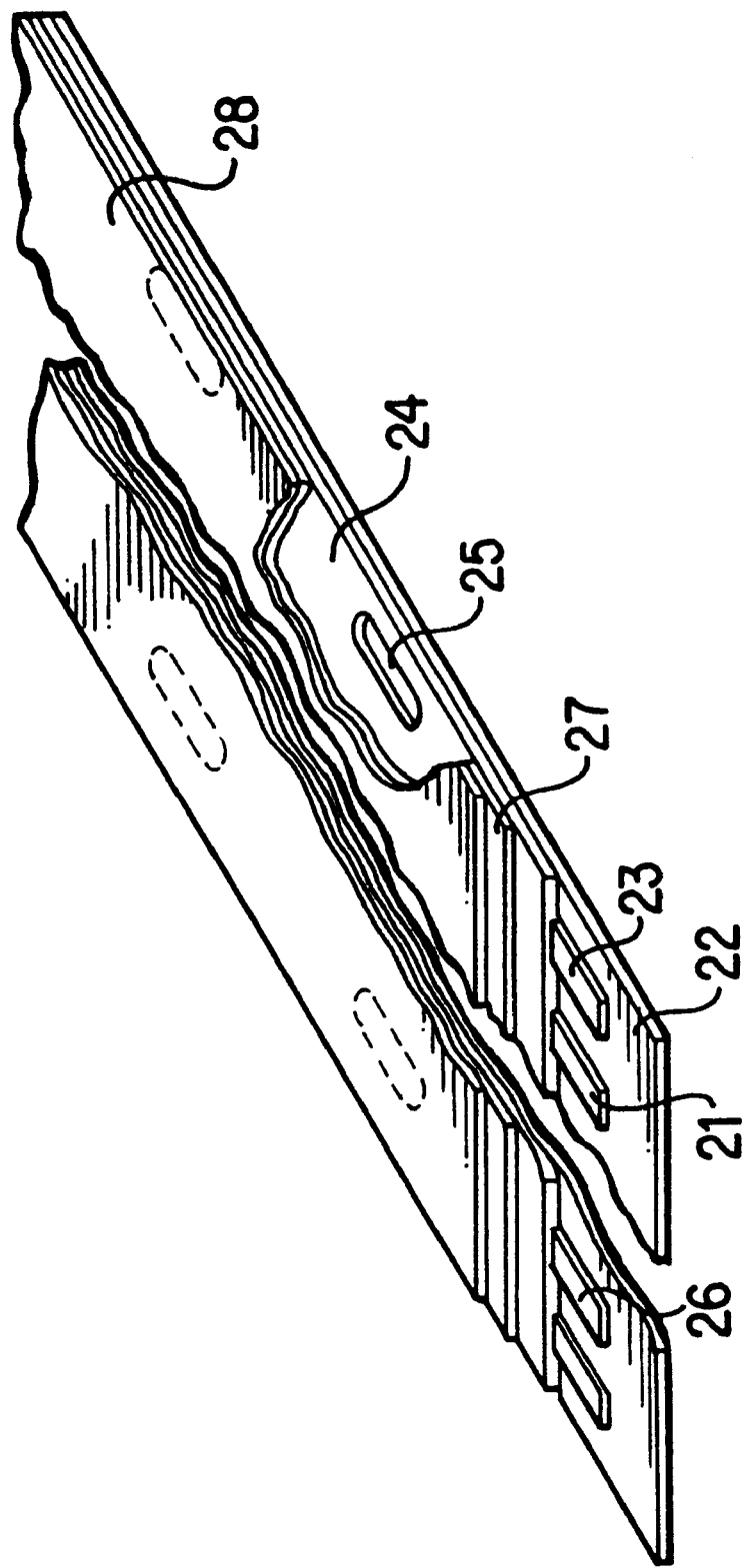
FIG. 3 is a perspective view showing an electromagnetic-shielded flexible printed circuit assembly as exploded in the longitudinal direction and locally scraped off.

FIG. 3 shows an electromagnetic-shielded flexible printed circuit assembly.

A linear copper foil circuit 21 (30 μm thick, 1 mm wide, intervals 1 mm, 10 units of 15 lines) was formed on a 50 μm-thick polyimide film 22 by the etched foil method. It should be noticed that, of the 15 lines, 2 lines at both ends are ground patterns 23.

On the above copper foil circuit 21, there are disposed masks at predetermined intervals in the lengthwise direction of said ground pattern 23 and using a screen (not shown) having masks in predetermined positions at both ends of the circuit, a 30 μm thick UC layer 24 is formed by printing with an epoxymelamine resin paste. In this connection, through-holes 25 are formed by the masks of said screen in the longitudinal UC layer 24 on the ground pattern 23 so that the no UC layer is formed by the masks of the screen at both ends of the circuit and, hence, the circuit is exposed at 26.

A mill is charged with 100 parts by weight of a dendritic copper metal powder with a grain size distribution of 5 to 10 μm, a specific surface area of not more than 0.4 m²/g and a hydrogen reduction loss of not more than 0.25%. Then, the titanate was added in small portions with constant stirring to coat the copper metal powder with the titanate. Thereafter, the copper metal powder was kneaded with the resole phenolic resin, chelating agent, adhesion improving agent and conductivity improving agent to give the composition of Example 2 (Table 1). Then, after addition of some amount of butylcarbitol as a solvent, the composition was kneaded with a three-roll mill for 20 minutes to prepare an electroconductive coating composition having a suitable viscosity. This electroconductive coating composition was coated all over, leaving both ends of the UC layer 24, by the screen printing method and the coating layer was cured by heating at 160° C. for 30 minutes, whereby a 20 μm thick shield layer 27 was formed. In this process, the electroconductive coating composition reached the ground pattern 23 through the through-holes 25 so as to electrically connect the shield layer 27 to the ground pattern 23.

Then, by the screen printing method, a one-component type heat-curable silicone rubber coating material [TSE 3251, Toshiba Silicone] was applied on said shield layer 27 and cured at 150° C. for 1 hour to give an OC layer 28 having a thickness of 20 μm. This completed the manufacture of an electromagnetic-shielded flexible printed circuit assembly in accordance with the invention.

When this assembly was subjected to a ±90° repeated flexure test with a 5 mm mandrel, no abnormality was found even after 100,000 flexure cycles. The test is still continuing at this writing.

Incidentally, when the OC material was replaced with epoxy-melamine resin, the product developed cracks after only tens of cycles.

What is claimed is:

1. A printed circuit board comprising a substrate, a copper foil circuit formed on at least one side of said substrate board, a first insulating layer disposed on non-connected circuit regions between predetermined circuit regions to be connected of said copper foil circuit, a jumper circuit interconnecting said predetermined circuit regions over said first insulating layer and a second insulating layer covering the printed circuit including said jumper circuit, said jumper circuit being formed from an electroconductive coating composition comprising
   (A) 100 parts by weight of a copper metal powder coated with 0.05 to 0.2 weight part of a titanate, a zirconate or a mixture thereof:
   (B) 5 to 30 parts by weight of resole phenolic resin;
   (C) 0.5 to 4 parts by weight of a chelating agent;
   (D) 0.1 to 5 parts by weight of an adhesion improving agent; and
   (E) 0.5 to 7 parts by weight of a conductivity improving agent.

2. A printed circuit board comprising a substrate, a copper foil circuit including a ground pattern as formed on at least one side of said substrate, an insulating layer formed on said substrate carrying said copper foil circuit in such a manner as to cover said copper foil circuit exclusive of at least a region of said ground pattern, and a conductive layer formed on said insulating layer in contact with the uninsulated region of said ground pattern, said conductive layer being formed from an electroconductive coating composition comprising (A) 100 parts by weight of a copper metal powder coated with 0.05 to 0.2 weight part of a titanate, a zirconate or a mixture thereof;

(B) 5 to 30 parts by weight of resole phenolic resin;

(C) 0.5 to 4 parts by weight of a chelating agent;

(D) 0.1 to 5 parts by weight of an adhesion improving agent; and (E) 0.5 to 7 parts by weight of a conductivity improving agent.

3. A flexible printed circuit assembly comprising a copper foil circuit formed on a heat-resistant plastic film and, as formed successively on said circuit, an undercoat layer, a metal powder-containing electroconductive paste shield layer and an overcoat layer, with a ground pattern of said copper foil circuit and said metal powder-containing electroconductive paste shield layer being electrically connected to each other at appropriate intervals through the undercoat layer, said shield layer being formed from an electroconductive coating composition comprising (A) 100 parts by weight of a copper metal powder coated with 0.05 to 0.2 weight part of a titanate, a zirconate or a mixture thereof;

(B) 5 to 30 parts by weight of resole phenolic resin;

(C) 0.5 to 4 parts by weight of a chelating agent;

(D) 0.1 to 5 parts by weight of an adhesion improving agent; and (E) 0.5 to 7 parts by weight of a conductivity improving agent.

4. The electromagnetic-shielded flexible printed circuit assembly of claim 3 wherein said heat-resistant plastic film is a polyester, polyimide, polybenzimidazole, polyimideamide or adhesive silicone resin film.

5. The electromagnetic-shielded flexible printed circuit assembly of claim 3 wherein said undercoat and overcoat are formed from a one-component heat-curable silicone rubber or two-component heat-curable silicone adhesive.

* * * * *